United States Patent
Pua et al.

(10) Patent No.: US 7,441,068 B2
(45) Date of Patent: Oct. 21, 2008

(54) FLASH MEMORY AND METHOD FOR UTILIZING THE SAME

(75) Inventors: Khein-Seng Pua, Hsinchu (TW); Horace Chen, Hsinchu (TW)

(73) Assignee: Phison Electronics Corp., Hsinchu (TW)

( * ) Notice: Subject to any disclaimer, the term of this patent is extended or adjusted under 35 U.S.C. 154(b) by 365 days.

(21) Appl. No.: 11/326,322

(22) Filed: Jan. 6, 2006

(65) Prior Publication Data

US 2007/0162687 A1    Jul. 12, 2007

(51) Int. Cl.
*G06F 12/02* (2006.01)
(52) U.S. Cl. .................. 711/103; 711/153; 711/173
(58) Field of Classification Search ................ 711/170
See application file for complete search history.

(56) References Cited

U.S. PATENT DOCUMENTS

| | | | |
|---|---|---|---|
| 4,489,401 A | 12/1984 | Smarandoiu et al. | |
| 5,200,959 A | 4/1993 | Gross et al. | |
| 6,901,498 B2 * | 5/2005 | Conley | 711/173 |
| 7,106,636 B2 * | 9/2006 | Eilert et al. | 365/189.12 |
| 7,171,536 B2 * | 1/2007 | Chang et al. | 711/170 |
| 2004/0111553 A1 | 6/2004 | Conley | |
| 2007/0081385 A1 * | 4/2007 | Huang | 365/185.09 |

FOREIGN PATENT DOCUMENTS

| | | |
|---|---|---|
| CA | 2536994 | 3/2005 |
| EP | 0548564 B1 | 4/1998 |
| FR | 2555350 | 5/1985 |
| JP | 04-285799 | 10/1992 |
| WO | WO 2005/066974 A1 | 7/2005 |

* cited by examiner

*Primary Examiner*—Hetul Patel
(74) *Attorney, Agent, or Firm*—Bacon & Thomas, PLLC

(57) ABSTRACT

A flash memory and a method for utilizing the same are disclosed. The method for utilizing a flash memory includes the steps of: a) providing a flash memory of a single chip; b) formatting the flash memory and marking bad blocks of the flash memory as a bad-block area free of reliably saved data; c) calculating a capacity of an available memory with the flash memory, wherein the available memory excludes the bad-block area of the flash memory; and d) dividing the available memory into a first storing memory and a second storing memory, wherein the first storing memory and the second storing memory have different capacities.

10 Claims, 4 Drawing Sheets

FLASH MEMORY AND METHOD FOR UTILIZING THE SAME

FIELD OF THE INVENTION

The present invention relates to a flash memory of a single chip and a method for utilizing the same.

BACKGROUND OF THE INVENTION

A flash memory is a type of EEPROM that allows multiple memory locations to be erased or written in one programming operation. In lay terms, it is a form of rewritable memory chip that, unlike a Random Access Memory chip, saves its content without maintaining a power supply.

An ordinary EEPROM only allows one location at a time to be erased or written, meaning that flash memory can operate at higher effective speeds when the system uses it to read and write to different locations at the same time. All types of flash memory and EEPROM wear out after a certain number of erase operations, due to wear on the insulating oxide layer around the charge storage mechanism used to store data.

Flash memory is non-volatile, which means that it stores information on a silicon chip in a way that does not need power to maintain the information in the chip. In addition, flash memory offers fast read access times and solid-state shock resistance. These characteristics explain the popularity of flash memory for applications such as storage on battery-powered devices like mobile phones and personal digital assistants.

Common flash memory parts (individual internal components or "chips") range widely in capacity from kilobits to hundreds of megabits each. Toshiba and SanDisk have developed a NAND flash chip capable of storing 8 gigabits (1 gigabyte) of data using MLC (multi-level cell) technology, capable of storing 2 bits of data per cell. In September 2005, Samsung Electronics, by far the world's largest manufacturer of NAND flash with ~40% of bit market share, announced that it had developed the world's first 16 gigabit NAND flash memory chip. With the introduction of Samsung's 16 gigabit chips came the iPod nano, a flash device available in 2 GB and 4 GB capacities, which use two 1 gigabyte Toshiba chips and two 2 gigabyte Samsung chips respectively, according to the autopsies done by Ars Technica and Inpress Direct. Up to date NAND spot pricing is available. In efforts to focus on increasing capacities, 32 MB and smaller capacity flash memory has been largely discontinued, and 64 MB capacity flash memory is being phased out.

Nowadays, the memory is commonly used in memory cards, USB flash drives, MP3 players, digital cameras and mobile phones. Usually, it is available in capacities of 64 M, 128 M, 256 M, 512 M, 1 G and 2 G in a single memory chip. However, when the memory chip is manufacturing, there could be bad blocks (usually the capacity of a sector) that cannot reliably save data due to a physical flaw of damaged format markings. Possibly, a memory chip is manufactured in capacities of 1 G, wherein it also contains bad blocks about 200 M. Therefore, this memory chip can't be applied for 1 G flash memory.

Therefore, it needs to provide a flash memory of single chip and a method for utilizing the same, which divides the flash memory into at least two logical memories in different capacities for facilitating to optimize the memory space thereof, and can rectify those drawbacks of the prior art and solve the above problems.

SUMMARY OF THE INVENTION

This paragraph extracts and compiles some features of the present invention; other features will be disclosed in the follow-up paragraph. It is intended to cover various modifications and similar arrangements included within the spirit and scope of the appended claims, and this paragraph also is considered to refer.

Accordingly, the prior art is limited by the above problems. It is an object of the present invention to provide a flash memory of single chip, wherein the flash memory is divided into at least two logical memories in different capacities for facilitating to optimize the memory space thereof.

In accordance with an aspect of the present invention, a flash memory of a single chip with a default capacity includes a bad-block area having damaged-format marking and free of reliably saved data, with a specified capacity; a first logical area for providing a first storing memory to save data; and a second logical area for providing a second storing memory to save data, where the first storing memory and the second storing memory have different capacities.

Preferably, the specified capacity is more than 10% of the default capacity.

Preferably, the first storing memory has a capacity of $2^p$ bytes and the second storing memory has a capacity of $2^q$ bytes, where p and q each is a natural number.

Preferably, p is larger than q.

Preferably, the first storing memory and the second storing memory can load data from each other via an application program therein.

Preferably, the first storing memory and the second storing memory are write-protected.

In accordance with another aspect of the present invention, a flash memory of a single chip with a default capacity includes a bad-block area having damaged-format marking and free of reliably saved data, with a specified capacity; a first logical area for providing a first storing memory to save data; a second logical area for providing a second storing memory to save data; and a third logical area for providing a third storing memory to save data, where the first storing memory, the second storing memory, and the third storing memory have different capacities.

Preferably, the specified capacity is more than 10% of the default capacity.

Preferably, the first storing memory, the second storing memory and the third storing memory have capacities of $2^p$, $2^q$, and $2^r$ bytes, respectively, where p, q and r each is a natural number.

Preferably, p is larger than q and q is larger than r.

Preferably, the first storing memory, the second storing memory and the third storing memory can load data from one another via an application program therein.

Preferably, the first storing memory, the second storing memory and the third storing memory are write-protected.

Accordingly, the prior art is limited by the above problems. It is another object of the present invention to provide a method of a flash memory of single chip, which divides the flash memory into at least two logical memories in different capacities for facilitating to optimize the memory space thereof.

In accordance with an aspect of the present invention, a method for utilizing a flash memory includes the steps of: a) providing a flash memory of a single chip; b) formatting the flash memory and marking bad blocks of the flash memory as a bad-block area free of reliably saved data; c) calculating a capacity of an available memory with the flash memory, wherein the available memory excludes the bad-block area of the flash memory; and 3) dividing the available memory into a first storing memory and a second storing memory, wherein the first storing memory and the second storing memory have different capacities.

Preferably, the first storing memory has a capacity of $2^p$ bytes and the second storing memory has a capacity of $2^q$ bytes, where p and q each is a natural number.

Preferably, p is larger than q.

In accordance with another aspect of the present invention, a method for utilizing a flash memory includes steps of: a) providing a flash memory of a single chip; b) formatting the flash memory and marking bad blocks of the flash memory as a bad-block area free of reliably saved data; c) calculating a capacity of an available memory within the flash memory, wherein the available memory excludes the bad-block area of the flash memory; and d) dividing the available memory into a first storing memory and a second storing memory, and the third storing memory, wherein the first storing memory, the second storing memory and the third storing memory have different capacities.

Preferably, the first storing memory, the second storing memory and the third storing memory have capacities of $2^p$, $2^q$, and $2^r$ bytes, respectively, where p, q and r each is a natural number.

Preferably, p is larger than q and q is larger than r.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF THE PREFERRED EMBODIMENT

The present invention discloses a flash memory of a single chip and a method for utilizing the same, and the objects and advantages of the present invention will become more readily apparent to those ordinarily skilled in the art after reviewing the following detailed description. The present invention needs not be limited to the following embodiment.

Figure 1:
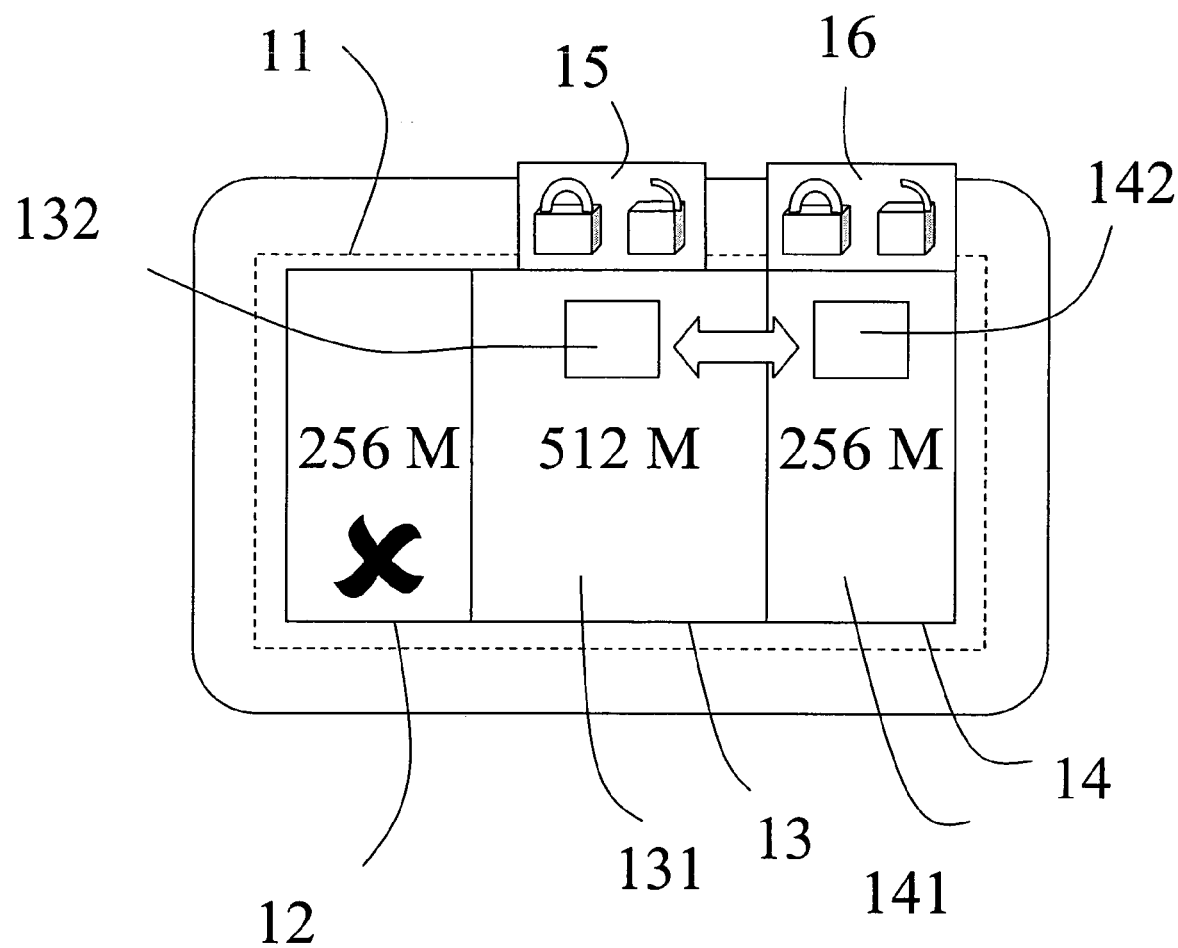
FIG. 1 illustrates a block diagram of an embodiment of a flash memory according to the present invention.

Please refer to FIG. 1. It illustrates a block diagram of an embodiment of a flash memory according to the present invention. The flash memory of single chip includes a bad-block area 12 having damaged-format marking and free of reliably saved data; a first logical area 13 for providing a first storing memory 131 to save data; and a second logical area 14 for providing a second storing memory 141 to save data, wherein the first storing memory 131 and the second storing memory 141 have different capacities.

In practice, the flash memory could be available in capacities of 64 M, 128 M, 256 M, 512 M, 1 G, and 2 G. In this embodiment, the flash memory 11 is available in capacities of 1 G, but the flash memory 11 also includes the bad-block area 12 about 256 M. Furthermore, the first storing memory 131 and the second storing memory 141 could be available in capacities of 64 M, 128 M, 256 M, 512 M, and 1 G. On the other hand, the first storing memory 131 and the second storing memory 141 have different capacities and the second storing memory 141 is smaller than the first storing memory 131. Thus, the first storing memory 131 is available in capacities of 512 M and the second storing memory 141 is available in capacities of 256 M, wherein the flash memory 11 even includes about 256 M bad-block area 12, but could be used by means of dividing the residue space of flash memory 11 into two logical memories in different capacities for facilitating to optimize the memory space thereof. Certainly, one of the first storing memory 131 and the second storing memory 141 is able to load data from the other via an application program 132 or 142 therein. Furthermore, the data in the first storing memory 131 is encrypted and write-protected via a first control notch 15; and the data in the second storing memory 141 is encrypted and write-protected via a second control notch 16. Therefore, the first storing memory 131 and the second storing memory 141 could be performed respectively and won't be restricted by each other.

Figure 2:
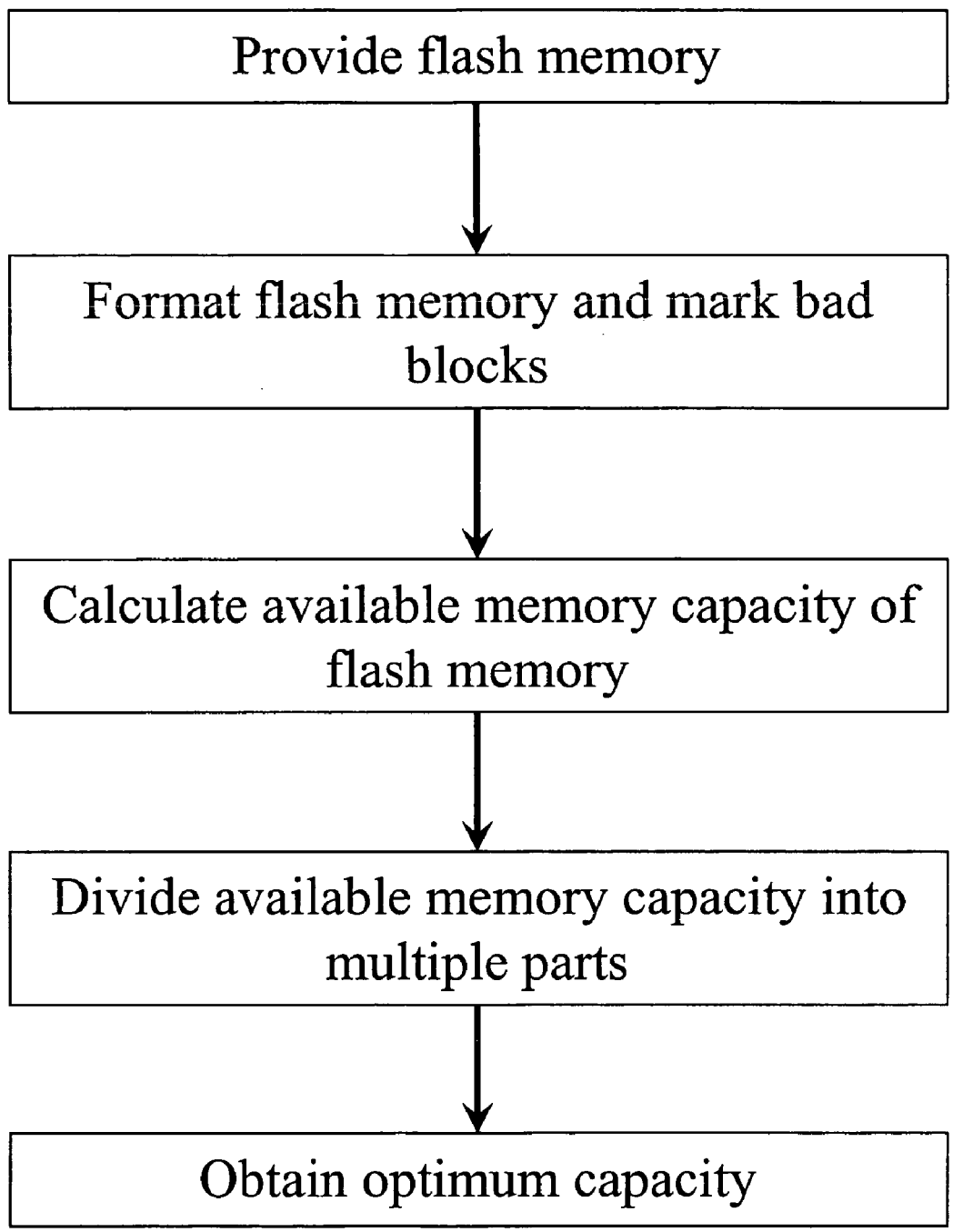
FIG. 2 illustrates a flow chart of an embodiment of a method for a flash memory according to the present invention.

Actually, the above flash memory is manufactured by the method of the present invention. Please refer to FIG. 2. It illustrates a flow chart of an embodiment of a method for a flash memory according to the present invention. Meanwhile, the method for utilizing a flash memory includes the steps of: a) providing a flash memory of a single chip; b) formatting the flash memory and marking bad blocks of the flash memory as a bad-block area free of reliably saved data; c) calculating a capacity of an available memory within the flash memory, wherein the available memory excludes the bad-block area of the flash memory; and d) dividing the available memory into a first storing memory and a second storing memory, wherein the first storing memory and the second storing memory have different capacities. In practice, a lot of flaw flash memories could be obtained in a normal producing flow. When a 1 G flash memory has been produced, there are too many bad blocks to provide available capacities of 1 G, just like the embodiment of FIG. 1. According to prior art, that 1 G flash memory with too many bad blocks will be thrown away or formatted as 512 M memory merely. However, the present invention could make this kind of flaw flash memories to be used with an optimum capacity.

Figure 3:
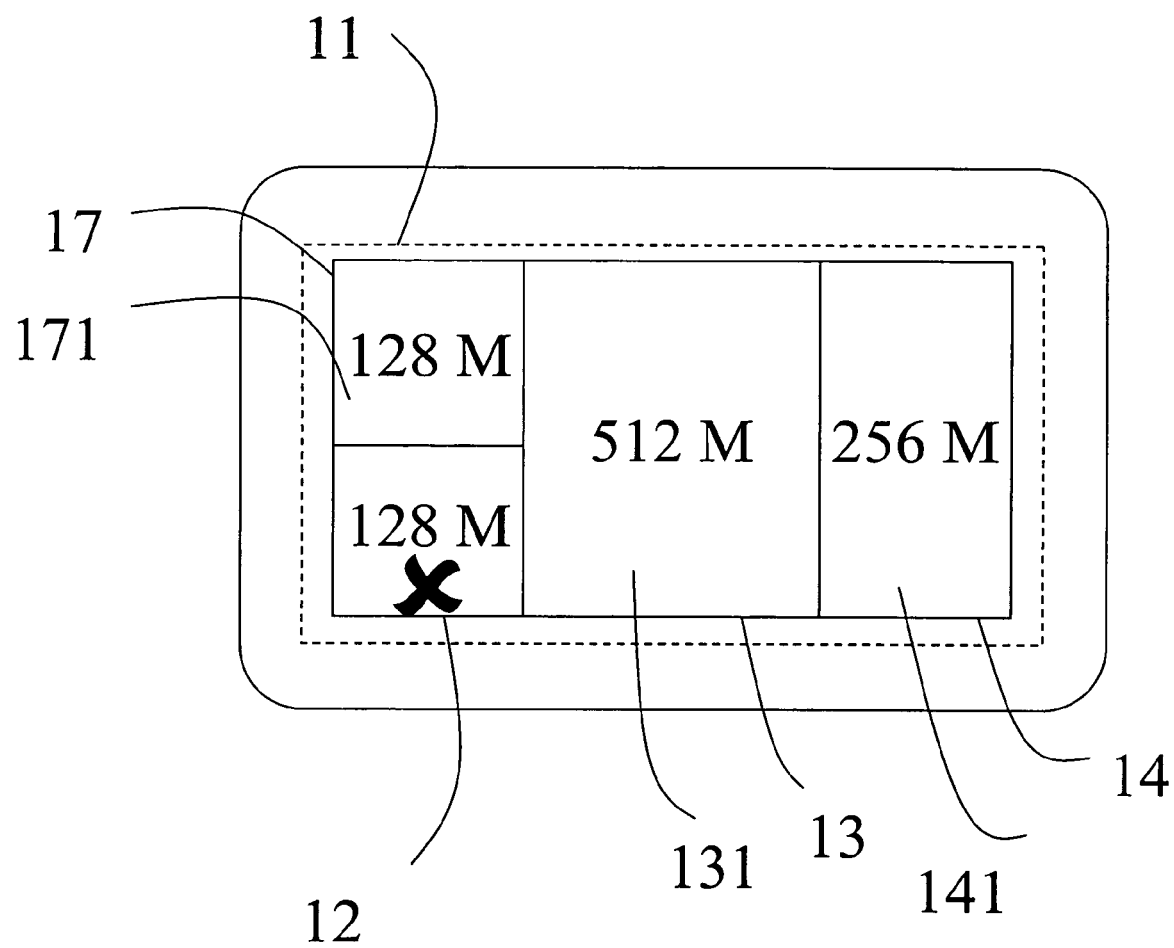
FIG. 3 illustrates a block diagram of another embodiment of a flash memory according to the present invention.
Figure 4:
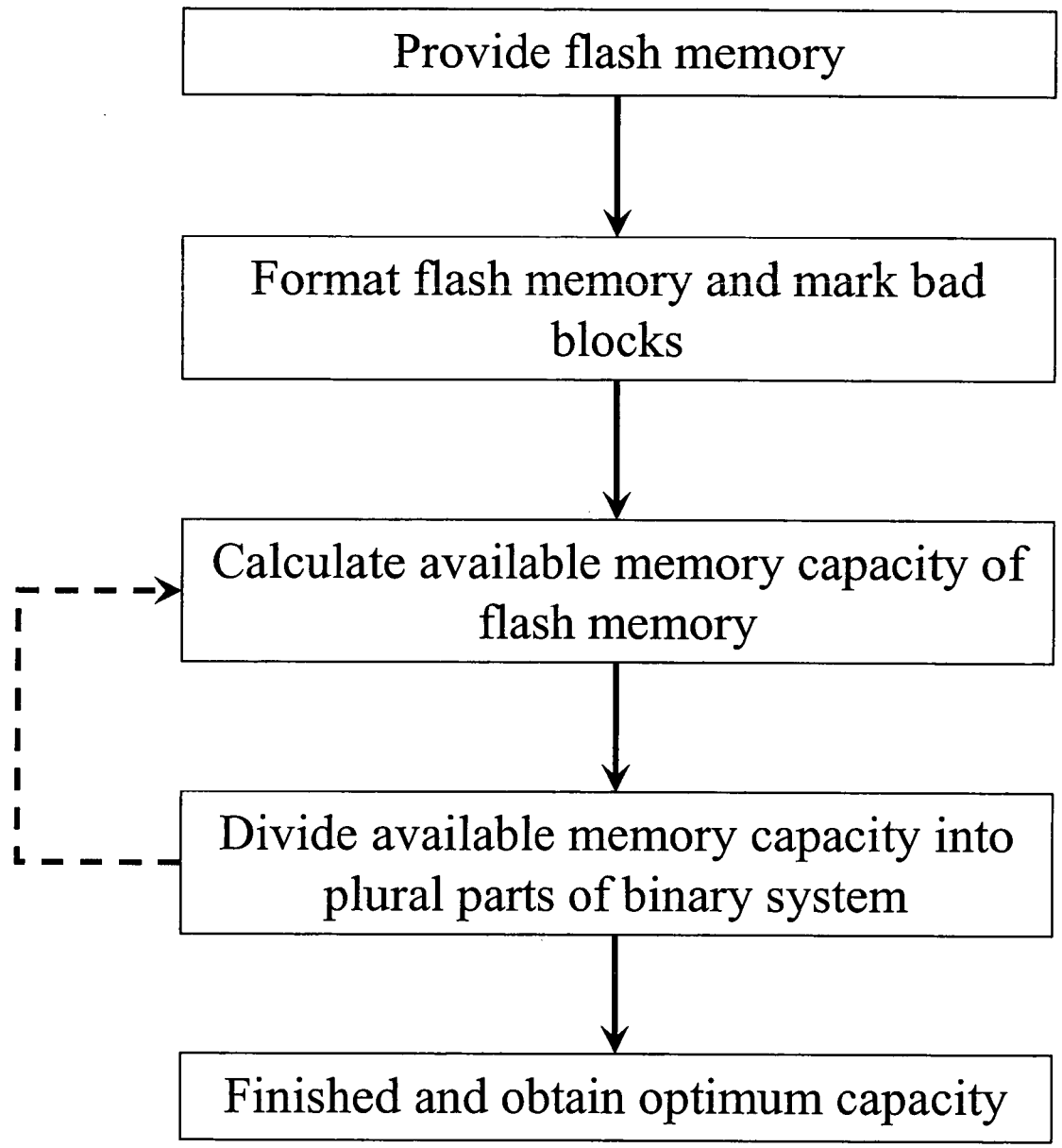
FIG. 4 illustrates a flow chart of another embodiment of a method for a flash memory according to the present invention.

Please refer to FIG. 3. It illustrates a block diagram of another embodiment of a flash memory according to the present invention. Meanwhile the flash memory 11 of single chip includes a bad-block area 12 having damaged-format marking of 128 M. Therefore, the flash memory could include a first logical area 13 for providing a first storing memory 131 of 512 M to save data; a second logical area 14 for providing a second storing memory 141 of 256 M to save data; and a third logical area 17 for providing a third storing memory 171 of 128 to save data, wherein the first storing memory 13, the second storing memory 14, and the third storing memory 17 have different capacities. Similarly, one of the first storing memory 131, the second storing memory 141, and the third storing memory 171 is able to load data from other one via an application program therein. Furthermore, the first storing memory 131, the second storing memory 141, and the third storing memory 171 could be performed respectively and won't be restricted by each other. Actually, the method of the present invention could be further disclosed as FIG. 4 according to the above descriptions. Please refer to FIG. 4. It illustrates a flow chart of another embodiment of a method for a flash memory according to the present invention. Specially, the method could further deal with a flaw flash memory. In step a), when a flash memory of single chip is provided, the flash memory is formatted and marked bad blocks as a bad-block area free of reliably saved data. Therefore, the available memory capacity will be decreased. In step b), the available memory capacity with bad-block area of the flash memory is calculated. After obtaining the value of the available memory, the capacity of available memory will be divided into plural parts of the binary system. For example, there are about 128 M bad-block area disposed in 1 G flash memory, as shown in FIG. 3. The residue available memory without the bad-block area could be divided into 512 M+256 M+128 M. Therefore, the flash memory 11 will includes the first storing memory 13 of 512 M, the second storing memory 14 of 256 M, and the third storing memory 17 of 128 M. Certainly, the present invention could divide the available memory of the flash memory without bad blocks into several logical memories of the binary system. For 1 G flash memory, if there are about 192 M bad blocks, the available memory could be divided into 512 M, 256 M, and 64 M, three logical memories for using. In other words, the flaw flash memory could be divided into several logical memories of the binary system in response to the bad blocks thereof and be used with an optimum capacity.

In conclusion, the present invention provides a flash memory of single chip and a method for utilizing the same by means of dividing the flash memory into at least two logical memories in different capacities for facilitating to optimize the memory space thereof. Thus, the flaw flash memory could be used with an optimum capacity. Meanwhile the prior art fail to disclose that. Accordingly, the present invention possesses many outstanding characteristics, effectively improves upon the drawbacks associated with the prior art in practice and application, produces practical and reliable products, bears novelty, and adds to economical utility value. Therefore, the present invention exhibits a great industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A flash memory of a single chip with a default capacity, comprising:
    a bad-block area having damaged-format marking and free of reliably saved data, with a specified capacity;
    a first logical area for providing a first storing memory with a capacity of $2^p$ bytes to save data, where p is a natural number greater than zero; and
    a second logical area for providing a second storing memory with a capacity of $2^q$ bytes to save data, where q is a natural number greater than zero and smaller than p;
    wherein said bad-block area is included neither in said first logical area nor in said second logical area.

2. The flash memory according to claim 1, wherein said specified capacity is more than 10% of said default capacity.

3. The flash memory according to claim 1, wherein said first storing memory and said second storing memory can load data from each other via an application program therein.

4. The flash memory according to claim 1, wherein said first storing memory and said second storing memory are write-protected.

5. A flash memory of a single chip with a default capacity, comprising:
    a bad-block area having damaged-format marking and free of reliably saved data, with a specified capacity;
    a first logical area for providing a first storing memory with a capacity of $2^p$ bytes to save data, where p is a natural number greater than zero; and
    a second logical area for providing a second storing memory with a capacity of $2^q$ bytes to save data, where q is a natural number greater than zero and smaller than p;
    a third logical area for providing a second storing memory with a capacity of $2^r$ bytes to save data, where r is a natural number greater than zero and smaller than p and q;
    wherein said bad-block area is not included in said first logical area, said second logical area, or said third logical area.

6. The flash memory according to claim 5, wherein said specified capacity is more than 10% of said default capacity.

7. The flash memory according to claim 5, wherein said first storing memory, said second storing memory and said third storing memory can load data from one another via an application program therein.

8. The flash memory according to claim 5, wherein said first storing memory, said second storing memory and said third storing memory are write-protected.

9. A method for utilizing a flash memory, comprising the steps of:
    providing a flash memory of a single chip;
    formatting said flash memory and marking bad blocks of said flash memory as a bad-block area free of reliably saved data;
    calculating a capacity of an available memory within said flash memory, wherein said available memory excludes said bad-block area of said flash memory; and
    dividing said available memory into a first storing memory with a capacity of $2^p$ bytes and a second storing memory with a capacity of $2^q$ bytes, where p and q each is a natural number greater than zero and p is larger than q.

10. A method for utilizing a flash memory, comprising the steps of:
    providing a flash memory of a single chip;
    formatting said flash memory and marking bad blocks of said flash memory as a bad-block area free of reliably saved data;
    calculating a capacity of an available memory within said flash memory, wherein said available memory excludes said bad-block area of said flash memory; and
    dividing said available memory into a first storing memory with a capacity of $2^p$ bytes, a second storing memory with a capacity of $2^q$ bytes, and a third storing memory with a capacity of $2^r$ bytes, where p, q and r each is a natural number greater than zero, p is larger than q and q is larger than r.

* * * * *